(12) United States Patent
Toyomura

(10) Patent No.: US 11,211,002 B2
(45) Date of Patent: Dec. 28, 2021

(54) ELECTROOPTICAL DEVICE AND ELECTRONIC APPARATUS

(71) Applicant: Sony Semiconductor Solutions Corporation, Kanagawa (JP)

(72) Inventor: Naobumi Toyomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/262,357

(22) PCT Filed: Sep. 3, 2019

(86) PCT No.: PCT/JP2019/034572
§ 371 (c)(1),
(2) Date: Jan. 22, 2021

(87) PCT Pub. No.: WO2020/050252
PCT Pub. Date: Mar. 12, 2020

(65) Prior Publication Data
US 2021/0327351 A1    Oct. 21, 2021

(30) Foreign Application Priority Data

Sep. 3, 2018    (JP) .............................. JP2018-164383

(51) Int. Cl.
*G09G 3/3233*    (2016.01)
*G09G 3/3291*    (2016.01)
*G09G 3/3266*    (2016.01)

(52) U.S. Cl.
CPC ......... *G09G 3/3233* (2013.01); *G09G 3/3266* (2013.01); *G09G 3/3291* (2013.01)

(58) Field of Classification Search
CPC ... G09G 3/3233; G09G 3/3266; G09G 3/3291
See application file for complete search history.

(56) References Cited

U.S. PATENT DOCUMENTS

2013/0093737 A1* 4/2013 Ota ..................... G09G 3/3233
345/204
2015/0187274 A1   7/2015 Kim
(Continued)

FOREIGN PATENT DOCUMENTS

JP    2011-39269 A    2/2011
JP    2016-139078 A   8/2016
(Continued)

OTHER PUBLICATIONS

International Search Report (PCT/ISA/210), International Application No. PCT/JP2019/034572, dated Nov. 5, 2019.
(Continued)

*Primary Examiner* — Stacy Khoo
(74) *Attorney, Agent, or Firm* — Michael Best & Friedrich LLP

(57) ABSTRACT

An electrooptical device and apparatus are disclosed. In one example, an electrooptical device includes a scanning line, a signal line, a feed line to which a low potential is supplied, a pixel circuit, a drive circuit for driving the pixel circuit, a level shift block connected to the signal line, a first capacitor on the level shift block, and a second capacitor formed by a parasitic capacitance between the signal line and the feed line. A video signal voltage is written into the pixel circuit by capacitive coupling between the first capacitor and the second capacitor. The signal line is formed of a first metal layer. The feed line is formed of a second metal layer that is approximately equal in width to the first metal layer. The first metal layer and the second metal layer form the first capacitor and the second capacitor.

8 Claims, 14 Drawing Sheets

(56) References Cited

U.S. PATENT DOCUMENTS

2017/0236885 A1      8/2017   Koshihara et al.
2018/0357957 A1*    12/2018   Ota ...................... G09G 3/3233

FOREIGN PATENT DOCUMENTS

| JP | 2017-83800 A  | 5/2017 |
| JP | 2017-146336 A | 8/2017 |
| JP | 2019-158988 A | 9/2019 |

OTHER PUBLICATIONS

Notification of Transmittal of the International Search Report and the Written Opinion of the International Searching Authority, or the Declaration (PCT/ISA/220), International Application No. PCT/JP2019/034572, dated Nov. 19, 2019.

\* cited by examiner

ELECTROOPTICAL DEVICE AND ELECTRONIC APPARATUS

TECHNICAL FIELD

The present technology relates to an electrooptical device and an electronic apparatus.

BACKGROUND ART

A known electrooptical device includes, as a light emitting element, an organic light emitting diode (OLED) element or the like. In an electrooptical device, a pixel circuit including a light emitting element, a transistor, and the like is provided in correspondence with a pixel at an intersection of a scanning line and a data line. In the pixel circuit, if a data signal at a potential according to a gradation level of the pixel is applied to a gate of the transistor, the transistor feeds a current according to a gate-source voltage to the light emitting element, so that the light emitting element emits light with a brightness according to the gradation level.

For example, Patent Document 1 discloses a pixel circuit for an organic EL, including five transistors and one capacitor. According to this pixel circuit, during one horizontal period, in a drive transistor threshold value correction period and in writing a video signal, a threshold voltage and a video signal are written into a parasitic capacitance on a signal line in addition to a capacitance in a pixel, so that operation is performed.

CITATION LIST

Patent Document

Patent Document 1: Japanese Patent Application Laid-Open No. 2014-186125

SUMMARY OF THE INVENTION

Problems to be Solved by the Invention

In Patent Document 1, a video signal voltage to be written into a signal line is specified by two capacitances. If the values of the two capacitances vary, the video signal voltage also varies, which may result in a problem that the consistency of uniformity is impaired.

An object of the present technology is to provide an electrooptical device and an electronic apparatus capable of reducing variations in capacitance for specifying a value of a video signal voltage, thereby preventing consistency of uniformity from being impaired.

Solutions to Problems

The present technology provides an electrooptical device including:
 a scanning line;
 a signal line;
 a feed line to which a low potential is supplied;
 a pixel circuit provided in correspondence with the signal line and the scanning line;
 a drive circuit configured to drive the pixel circuit;
 a level shift block connected to the signal line;
 a first capacitor provided on the level shift block; and
 a second capacitor formed by a parasitic capacitance between the signal line and the feed line,
 in which a video signal voltage is written into the pixel circuit by capacitive coupling between the first capacitor and the second capacitor,
 the signal line is formed of a first metal layer,
 the feed line is formed of a second metal layer that is approximately equal in width to the first metal layer, and
 the first metal layer and the second metal layer form the first capacitor and the second capacitor.

Furthermore, the present technology provides an electronic apparatus including the electrooptical device described above.

According to at least one embodiment, it is possible to reduce variations in capacitance for specifying a value of a video signal voltage, thereby preventing consistency of uniformity from being impaired. Note that the effects described herein are not necessarily limitative, and there may be achieved any one of the effects described in the present technology or effects different from the effects. Furthermore, the contents of the present technology are not limitedly interpreted by the illustrative effects in the following description.

MODE FOR CARRYING OUT THE INVENTION

Figure 1:
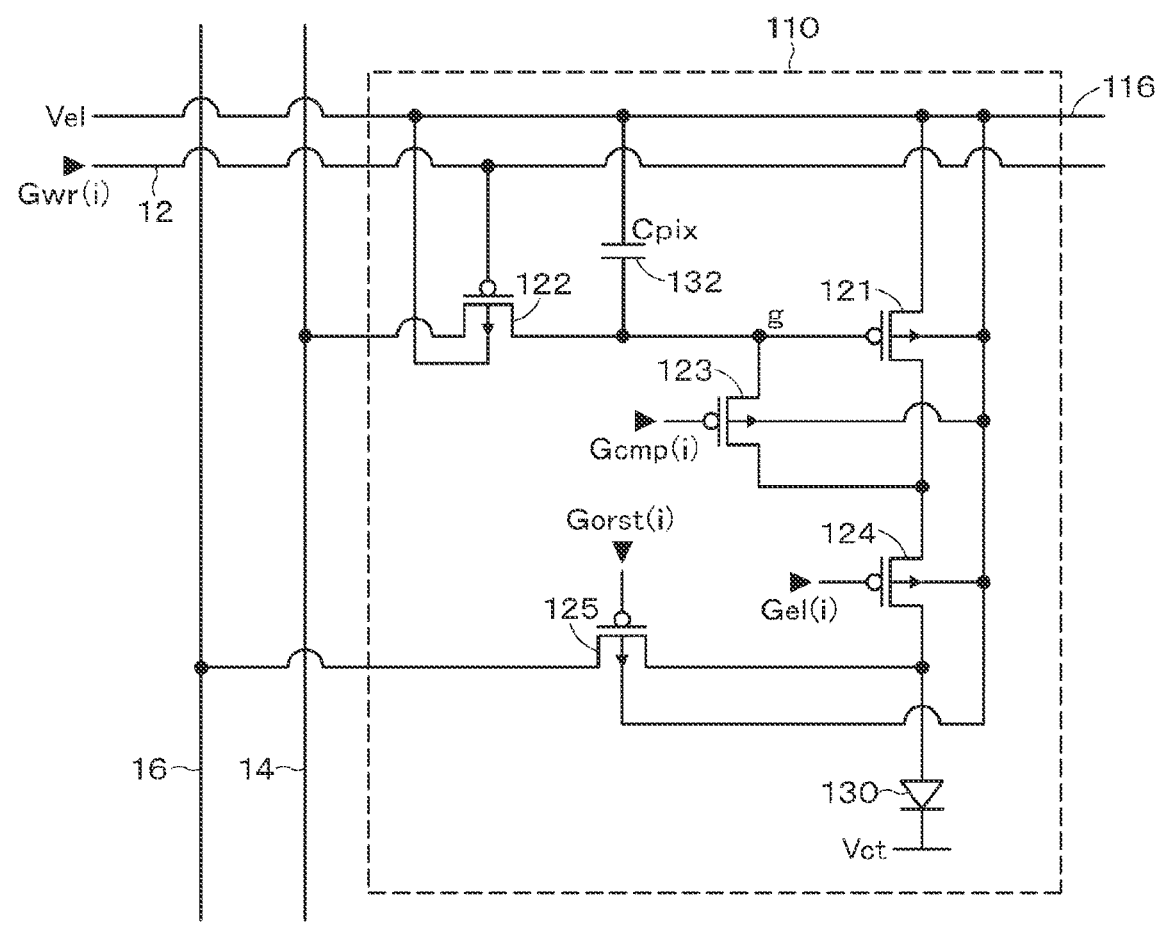
FIG. 1 is a connection diagram of an example of a conventional pixel circuit. A connection diagram of an embodiment of a pixel circuit according to the present technology.

Embodiments to be described below are suitable specific examples of the present technology, to which technically preferable various limitations are added.

However, the scope of the present technology is not limited to these embodiments unless there is a mention limiting particularly the present technology in the following description.

Note that the description of the present technology is given in the following order.

<1. Conventional configuration>
<2. First embodiment of the present technology>
<3. Second embodiment of the present technology>
<4. Third embodiment of the present technology>
<5. Fourth embodiment of the present technology>
<6. Fifth embodiment of the present technology>
<7. Modification examples>
<8. Application examples>

1. Conventional Configuration

Prior to the description of an embodiment of the present technology, a description will be given of a conventional configuration disclosed in Patent Document 1. Although not illustrated in the figure, an electrooptical device includes a display panel and a control circuit configured to control operation of the display panel. The display panel includes a plurality of pixel circuits and a drive circuit configured to drive the pixel circuits. The plurality of pixel circuits and the drive circuit of the display panel are formed on a silicon substrate, and an OLED which is an example of a light emitting element is used as the pixel circuits.

Digital image data is supplied to the control circuit in synchronization with a synchronizing signal. The image data is data that specifies, with, for example, 8 bits, a gradation level of a pixel of an image to be displayed on the display panel. Furthermore, the synchronizing signal is a signal including a vertical synchronizing signal, a horizontal synchronizing signal, and a dot clock signal. The control circuit generates various control signals on the basis of the synchronizing signal, and supplies the control signals to the display panel. Furthermore, the control circuit includes a voltage generation circuit. The voltage generation circuit supplies various potentials to the display panel. Moreover, the control circuit generates an analog image signal on the basis of the image data.

The display panel includes a display unit and a drive circuit configured to drive the display unit. In the display unit, a plurality of scanning lines is arranged in the row direction (horizontal direction), and a plurality of signal lines is arranged in the column direction (vertical direction) Y. A plurality of pixel circuits 110 connected to each one of the plurality of scanning lines and each one of the plurality of signal lines is arranged in a matrix form.

In the display unit, a plurality of scanning lines is arranged in the row direction (horizontal direction), and a plurality of signal lines is arranged in the column direction (vertical direction) Y. A plurality of pixel circuits 110 connected to each one of the plurality of scanning lines and each one of the plurality of signal lines is arranged in a matrix form. Three pixel circuits 110 provided continuously along one scanning line respectively correspond to a R (red) pixel, a G (green) pixel, and a blue (B) pixel, and these three pixels represent one dot of a color image.

With reference to FIG. 1, a description will be given of an example of a pixel circuit 110. The pixel circuit 110 is connected to a scanning line 12 and a signal line 14. The pixel circuit 110 on the i-th row includes P-type transistors 121 to 125, an OLED 130, and a retention capacitor 132. A scanning signal Gwr(i) and control signals Gel(i), Gcmp(i), and Gorst(i) are supplied to the pixel circuit 110.

The drive transistor (the first transistor) 121 has a source connected to a feed line 116, and a drain connected to the OLED 130 via the fourth transistor 124 to control a current flowing through the OLED 130. The second transistor 122 configured to write a signal line potential (a gradation potential) has a gate connected to the scanning line 12, and a drain and a source one of which is connected to the signal line 14 whereas the other one of which is connected to the gate of the first transistor 121.

The retention capacitor 132 is connected between a gate line of the first transistor 121 and the feed line 116, and retains a source-gate voltage of the first transistor 121. A high potential Vel of a power supply is fed to the feed line 116. The OLED 130 has a cathode serving as a common electrode, and is set at a low potential Vct of the power supply.

The third transistor 123 has a gate to which the control signal Gcmp(i) is input, and develops a short circuit between the gate and the drain of the first transistor 121 in accordance with the control signal Gcmp(i) to compensate for variations in threshold value of the first transistor 121.

The lighting control transistor 124 for the OLED 130 has a gate to which the control signal Gel(i) is input, and switches between a connection and a disconnection of the drain of the first transistor 121 to and from an anode of the OLED 130. The reset transistor (the fifth transistor) 125 has a gate to which the control signal Gorst(i) is input, and supplies a reset potential Vorst, which is a potential at the feed line 16, to the anode of the OLED 130 in accordance with the control signal Gorst(i). A difference between the reset potential Vorst and a common potential Vct is set to be smaller than a light emission threshold value of the OLED 130. That is, the reset potential Vorst is a low potential.

Figure 2:
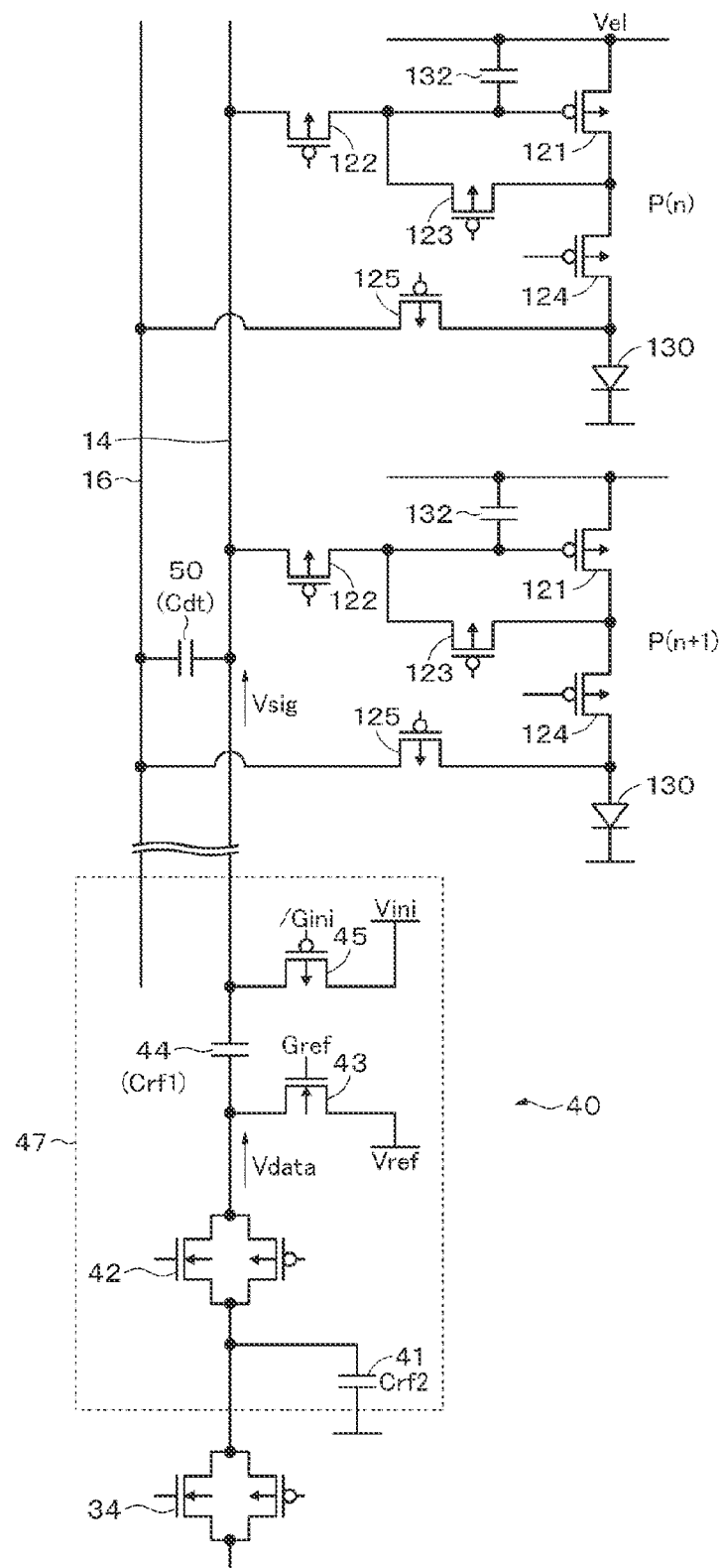
FIG. 2 is a connection diagram of a conventional pixel circuit and a conventional level shift circuit.

A scanning line drive circuit supplies a scanning signal Gwr(i) to the scanning line 12 on the i-th row. As illustrated in FIG. 2, a retention capacitor 50 is formed by a stray capacitance between the signal line 14 and the feed line 16 extending in the column direction Y. A level shift circuit 40 level shifts a gradation voltage received from a DA converter to a gate voltage for driving the transistor 121, by capacitive coupling using, for example, the retention capacitor 50 and the first retention capacitor 44 and second retention capacitor 41 in the level shift circuit 40 to supply the gate voltage to the signal line 14, in accordance with a data signal (a gradation level) supplied via the signal line drive circuit and a demultiplexer. The first retention capacitor 44 and the second retention capacitor 41 are a first capacitor. The retention capacitor 50 is a second capacitor.

A description will be given of the capacitive coupling. FIG. 2 illustrates a level shift block 47 corresponding to one pixel in the level shift circuit 40. With regard to the level shift block 47, only one signal line 14 is illustrated. The first retention capacitor 44 is connected to some midpoint in the signal line 14. An initialization switch 45 is provided to set an initial potential Vini for one end of the first retention capacitor 44. The initialization switch 45 has a gate to which a control signal/Gini is supplied. An initialization switch 43 configured to set a potential Vref for the other end of the first retention capacitor 44 has a gate to which a control signal Gref is supplied.

Moreover, a second retention capacitor 41 and a transfer gate 42 are provided. Since the second retention capacitor 41 and the transfer gate 42 are provided, a gradation voltage is supplied to the second retention capacitor 41 before a write period (an OFF period of the transfer gate 42, including an initialization period and a correction period), so that the second retention capacitor 41 can retain the gradation voltage. In the subsequent write period, a potential at an electrode of the first retention capacitor 44 can be changed to a potential at an electrode of the second retention capacitor 41 in such a manner that the transfer gate 42 is turned on.

In the initialization period (during which both the transistors 122 and 123 are turned off), potentials at both ends of the first retention capacitor 44 are respectively set at potentials Vini and Vref. At this time, the transistor 124 is turned off, and the transistor 125 is turned on. In the correction period (during which both the transistors 122 and 123 are turned on) subsequent to the initialization period, the transistor 123 is turned on. Therefore, the transistor 121 is diode-connected, so that the retention capacitor 132 in the pixel circuit 110 retains a threshold voltage Vth of the transistor 121.

In the write period (during which the transistor 122 is turned on) subsequent to the correction period, the transistor 123 is turned off, a transfer gate 34 of the demultiplexer is turned on, and the initialization switch 43 is turned off. Accordingly, a node on the other end of the first retention capacitor 44 fixed in the initialization period and the correction period is changed from the potential Vref to the gradation level.

In the foregoing circuit configuration, during one horizontal period, in the threshold value correction period of the first transistor (the drive transistor) 121 as well as in writing the video signal, the threshold voltage and the video signal are written into the retention capacitor 50 (a capacitor Cdt) on the signal line 14 in addition to the retention capacitor 132 (a capacitor Cs), so that operation is performed.

A video signal voltage Vsig to be input to the signal line 14 is represented by the following formula, using the retention capacitor 44 (a capacitor Crf1) of the level shift block 47 disposed outside a pixel region, the retention capacitor 50 (the capacitor Cdt) on the signal line 14, the retention capacitor 132 (the capacitor Cs), and an input voltage Vdata input from the level shift block 47.

$$Vsig=Vdata\times(Cdt+Cs)/(Crf1+Cdt+Cs)$$

Here, the following formula (1) is obtained from $Cdt \gg Cs$.

$$Vsig=Vdata\times Cdt/(Crf1+Cdt) \qquad (1)$$

Figure 3:
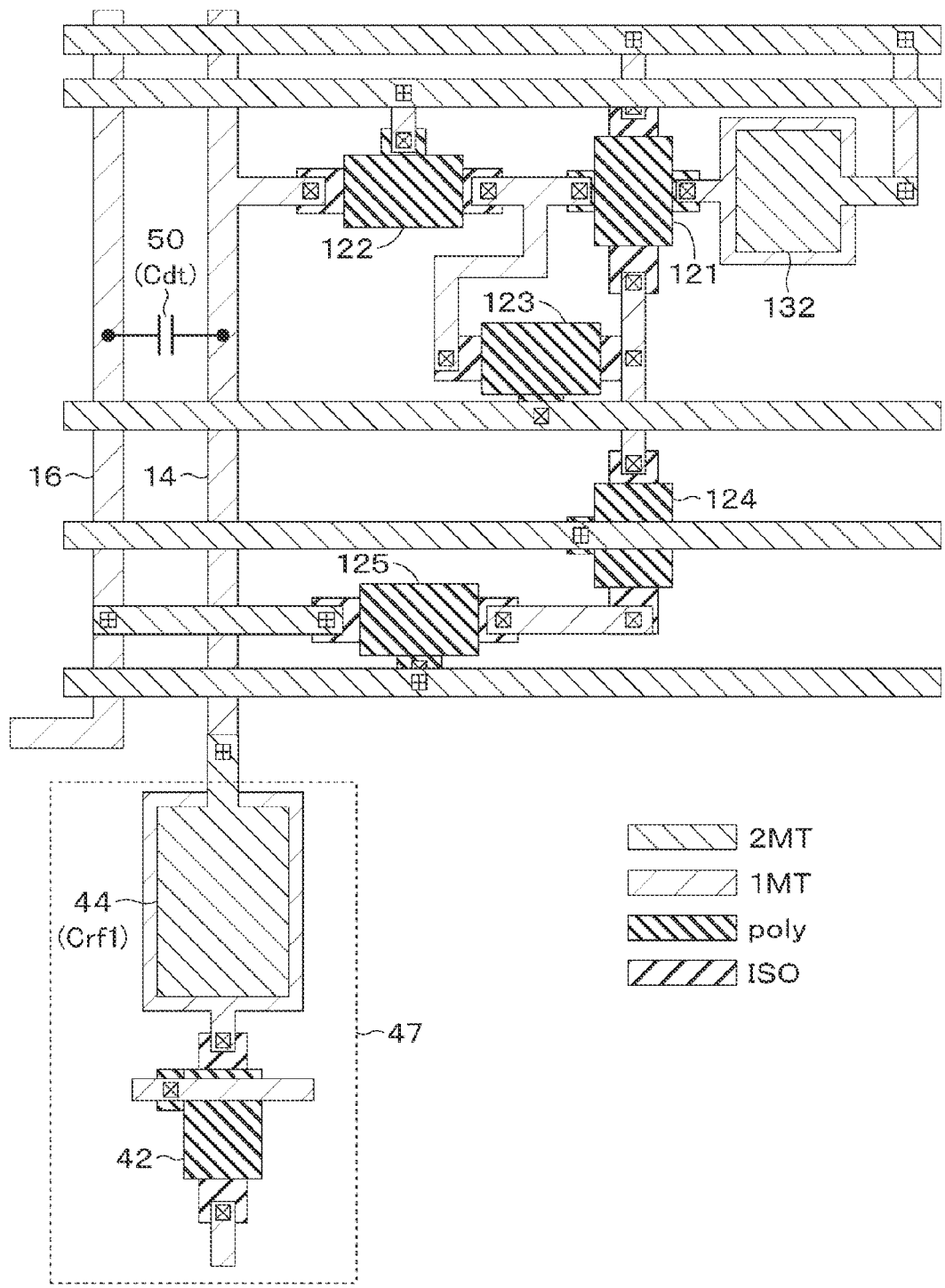
FIG. 3 is a plan view illustrating an example of a layout of the conventional pixel circuit and level shift circuit.

FIG. 3 schematically illustrates a layout corresponding to the foregoing conventional circuit configuration. Elements corresponding to the elements illustrated in FIGS. 1 and 2 are denoted with the identical reference signs. As illustrated in FIG. 3, a pattern of a first metal layer (referred to as 1MT), a second metal layer (referred to as 2MT), an insulating layer (referred to as ISO), and polysilicon (referred to as poly) is formed. The 1MT is identical in material (aluminum, copper, or the like) with the 2MT, and is equal in thickness to the 2MT. Furthermore, the 1MT is formed first, and the 2MT is then formed.

The retention capacitor 44 (the capacitor Crf1) of the level shift block 47 is formed in a metal-insulator-metal (MIM) configuration in which an insulating layer is interposed between metal layers (referred to as an interlayer capacitance). On the other hand, the retention capacitor 50 (the capacitor Cdt) is formed by a parasitic capacitance between the signal line 14 on the same layer and the feed line 16 to which the low potential is supplied.

The video signal voltage Vsig to be written into the signal line 14 is represented by formula (1). Therefore, the retention capacitor 50 (the capacitor Cdt) varies when the line width on the 1MT or the 2MT varies within a panel plane. In contrast to this, the retention capacitor 44 (the capacitor Crf1) formed by the interlayer capacitance does not depend on the variations in line width. That is, if there are variations in line width in formula (1), the fluctuation of the capacitor Crf1 becomes small as the capacitor Cdt varies. Accordingly, the value of Vsig varies with respect to the identical input voltage Vdata within a screen, so that the consistency of uniformity is impaired.

Figure 4:
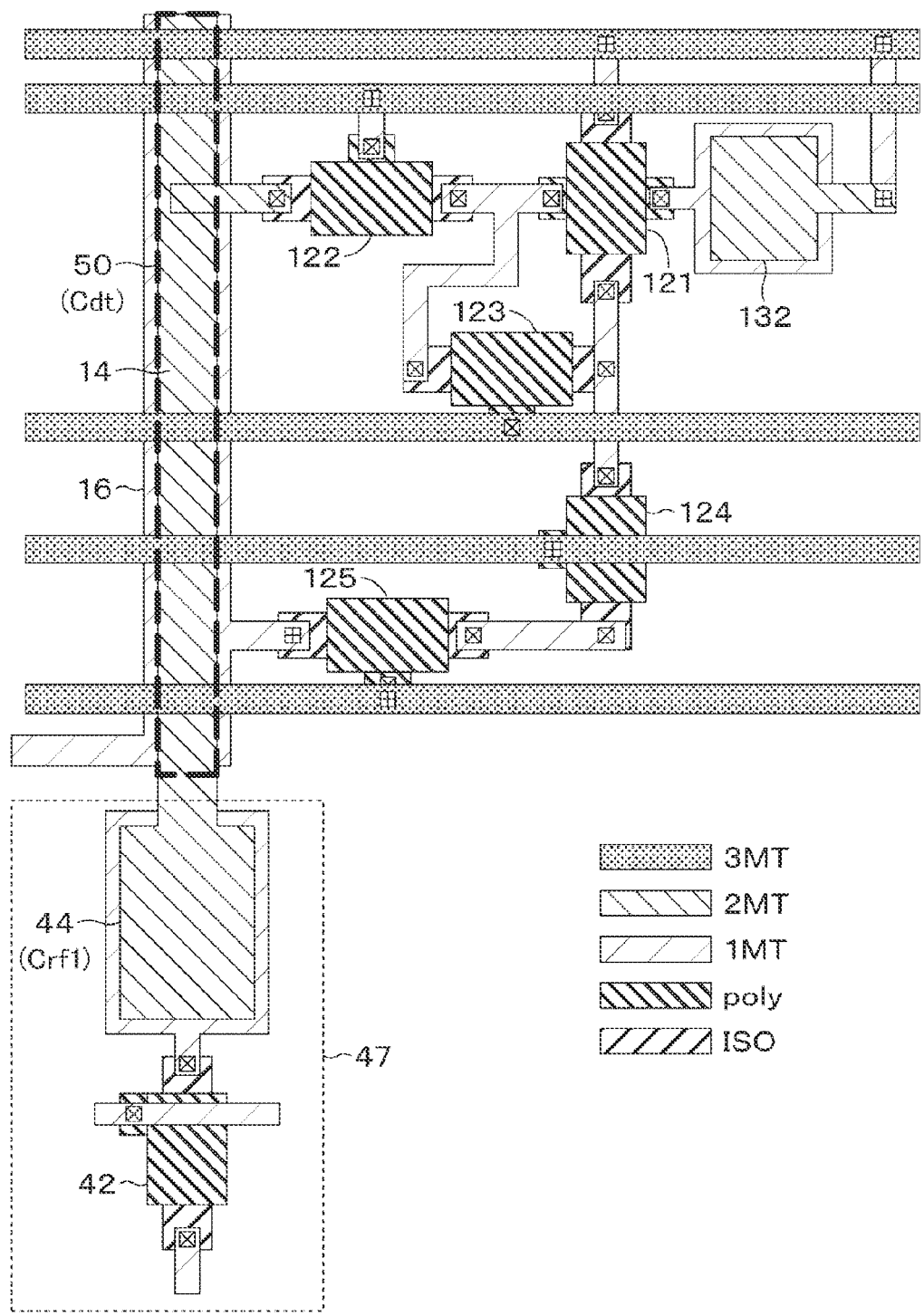
FIG. 4 is a plan view illustrating another example of the layout of the conventional pixel circuit and level shift circuit.

FIG. 4 illustrates another example of the conventional layout. In this layout, a signal line 16 is formed of a 1MT, a 2MT (a signal line 14) having the same width is stacked on the signal line 16, and a retention capacitor 50 (a capacitor Cdt) is formed as an interlayer capacitance. According to this configuration, variations in line width exert a similar influence on both a retention capacitor 44 and the retention capacitor 50.

However, the retention capacitor 44 is largely different in size in the vertical direction (the Y direction) from the retention capacitor 50, and is therefore different in ratio of a change in capacitance value owing to the variations in line width from the retention capacitor 50. Accordingly, also in the layout illustrated in FIG. 4, the variations in line width cause variations in value of the video signal voltage Vsig represented by formula (1), so that the consistency of uniformity is impaired.

2. First Embodiment of the Present Technology

Figure 5:
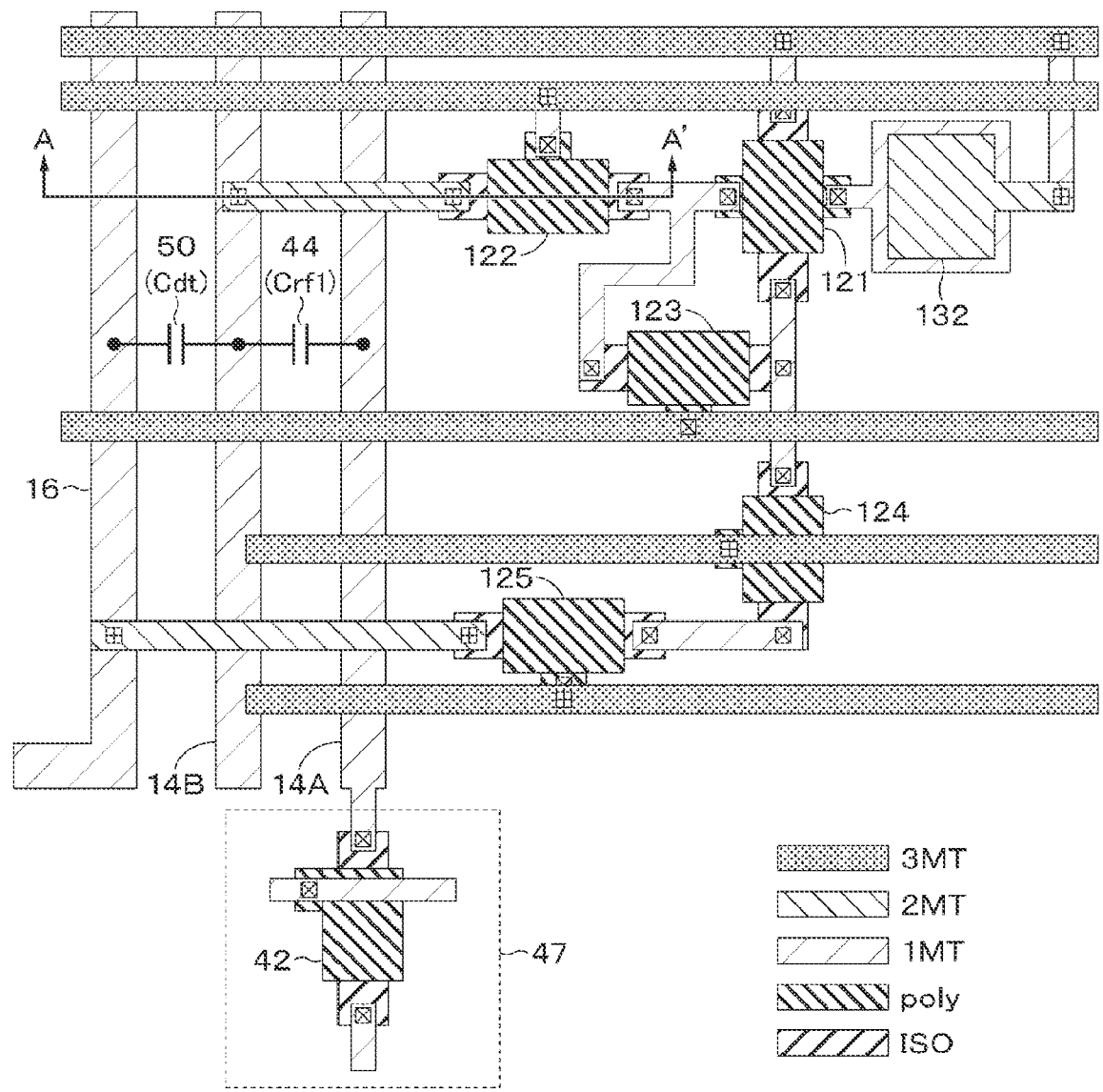
FIG. 5 is a plan view illustrating a layout of a first embodiment of the present technology.

With reference to FIG. 5, a description will be given of a first embodiment of the present technology. A pixel circuit 110 has a circuit configuration similar to that illustrated in FIG. 1. A level shift circuit 40 (a level shift block 47) has a circuit configuration similar to that illustrated in FIG. 2. According to the present technology, a layout is devised to prevent consistency of uniformity from being impaired due to variations in value of a video signal voltage Vsig relative to the same input voltage Vdata.

Figure 6:
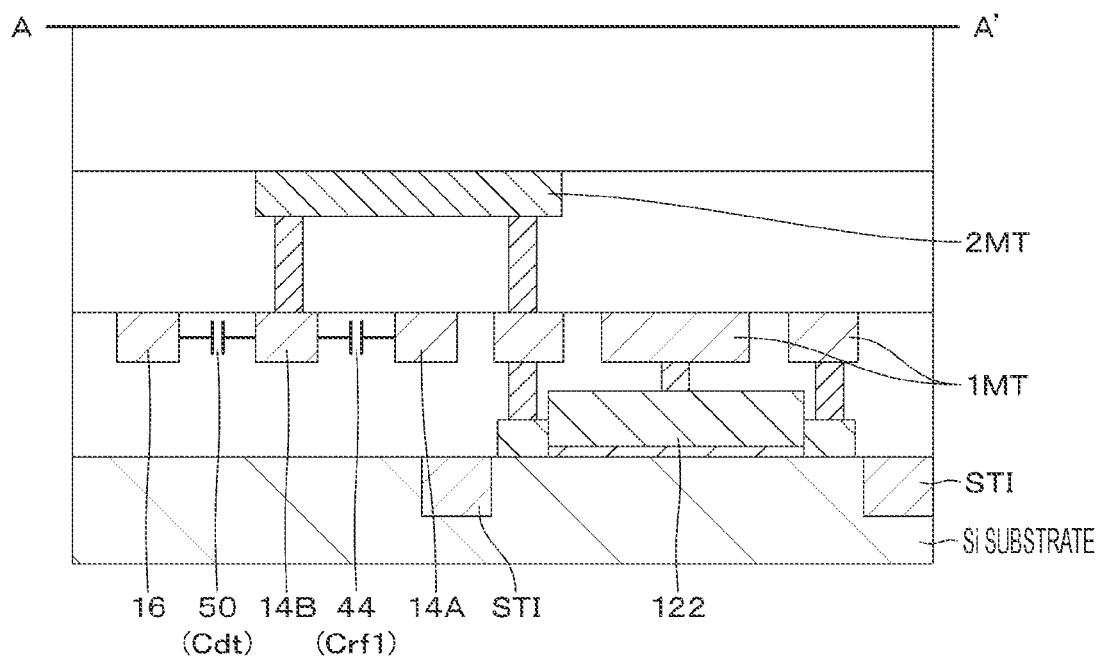
FIG. 6 is a sectional view of the first embodiment of the present technology.

FIG. 5 illustrates a layout in the first embodiment of the present technology. FIG. 6 is a sectional view taken along line A-A' in FIG. 5. Two data lines 14, that is, a first data line (a first metal layer) 14A and a second data line 14B (a third metal layer) are provided in parallel with two Y directions. The first data line 14A, the second data line 14B, and a feed line 16 are formed of a metal on the same layer, for example, a 1MT (a metal first layer). Note that the first data line 14A, the second data line 14B, and the feed line 16 may be formed to be equal in width and thickness to one another. Furthermore, one of electrode materials such as aluminum and copper is used as a metal material. In a case where copper is used, a wire may be formed by a damascene process. The damascene process reduces variations in thickness among the layers, and is therefore advantageous in achieving the object of the present technology.

A parasitic capacitance between the second data line 14B and the feed line 16 forms a retention capacitor (a second capacitor) 50 (Cdt). One of a drain and a source of a second transistor 122 is connected to the second data line 14B. Moreover, an output side of a transfer gate 42 of the level shift block 47 is connected to the first data line 14A. A parasitic capacitance formed between the first data line 14A and the second data line 14B forms a retention capacitor (a first capacitor) 44 (Crf1). A desired retention capacitor 44 is formed by setting a spacing between the first data line 14A and the second data line 14B, and the like. Note that shallow trench isoration (STI) in FIG. 6 corresponds to a portion where an insulator is embedded in a groove formed between elements for electrical isolation.

In the foregoing first embodiment of the present technology, both the capacitor Crf1 and the capacitor Cdt are formed as a parasitic capacitance using a metal on the same layer. Accordingly, in a case where the line widths of the metal forming the data lines 14A and 14B as well as the feed line 16 vary, these capacitors Crf1 and Cdt vary at the same ratio with the same tendency (increase or decrease). It is therefore possible to minimize the degree that the value of the video signal voltage Vsig represented by formula (1) varies due to the variations in line width. It is thus possible to prevent the consistency of uniformity from being impaired.

3. Second Embodiment of the Present Technology

Figure 7:
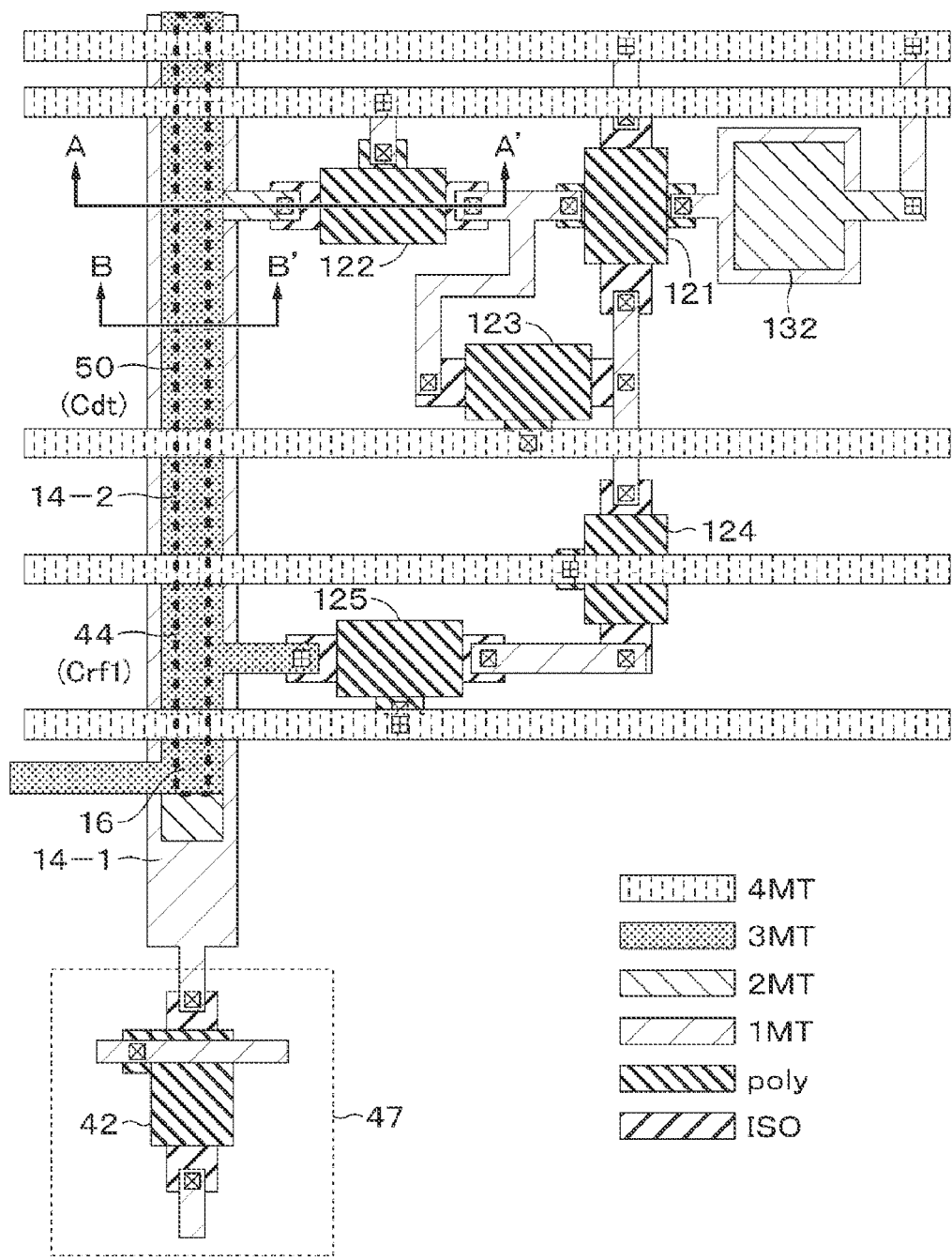
FIG. 7 is a plan view illustrating a layout of a second embodiment of the present technology.
Figure 8:
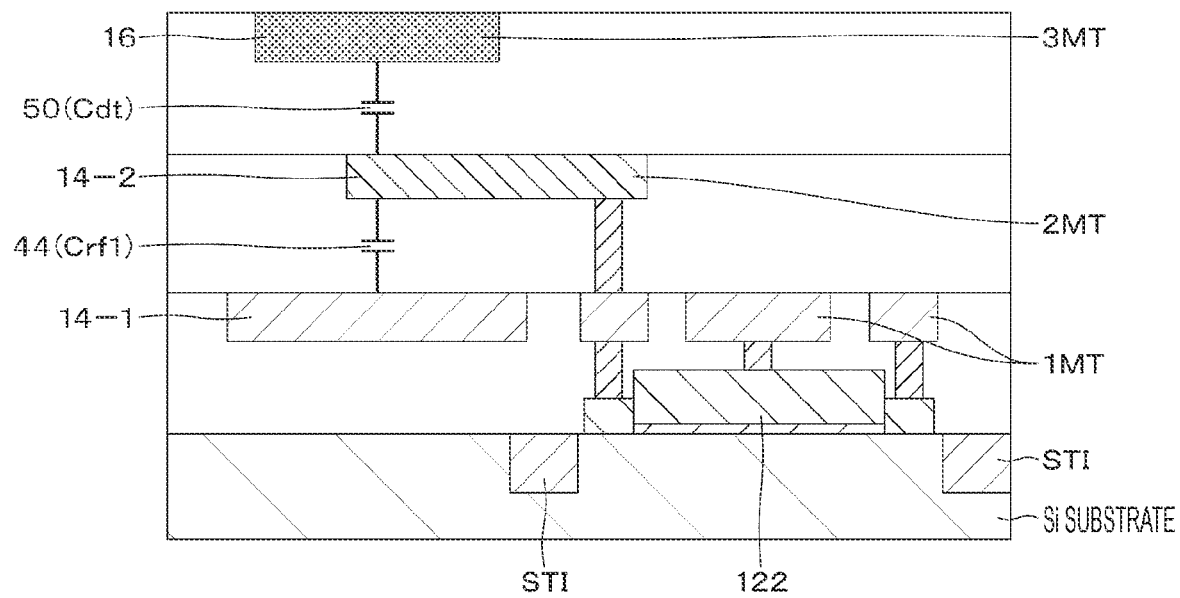
FIG. 8 is a sectional view of the second embodiment of the present technology.
Figure 9:
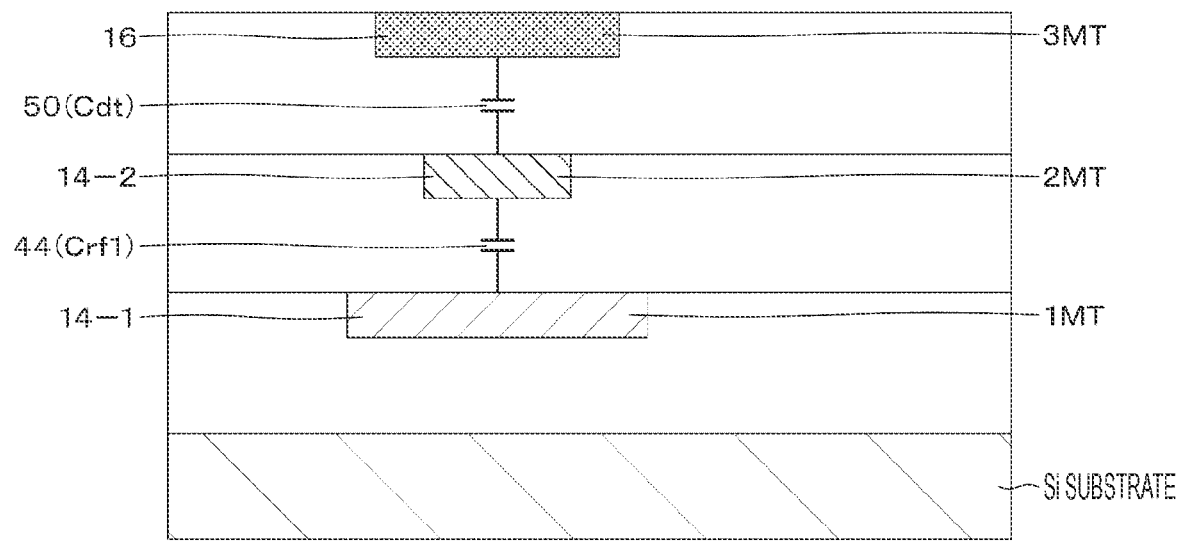
FIG. 9 is a sectional view of the second embodiment of the present technology.

With reference to FIG. 7, FIG. 8 (a sectional view taken along line A-A' in FIG. 7), and FIG. 9 (a sectional view taken along line B-B' in FIG. 7), a description will be given of a second embodiment of the present technology. A pixel circuit 110 has a circuit configuration similar to that illustrated in FIG. 1. A level shift circuit 40 (a level shift block 47) has a circuit configuration similar to that illustrated in FIG.

A first data line 14-1 (a first metal layer) is connected to an output side of a transfer gate 42. The first data line 14-1 is formed as a metal first layer (a 1MT). A second data line 14-2 (a third metal layer) formed as a metal second layer (a 2MT) is stacked on the first data line 14-1 with an insulating layer interposed between the second data line 14-2 and the first data line 14-1. One of a drain and a source of a first transistor 122 is connected to the second data line 14-2. The second data line 14-2 is smaller in width than the first data line 14-1. An interlayer capacitance formed by the first data line 14-1 and the second data line 14-2 is a first capacitor 44 (Crf1).

A feed line 16 (a third metal layer) formed as a metal third layer (a 3MT) is stacked on the second data line 14-2 with an insulating layer interposed between the feed line 16 and the second data line 14-2. The second data line 14-2 is smaller in width than the feed line 16. One of a drain and a source of a fifth transistor 125 is connected to the feed line 16. An interlayer capacitance formed by the second data line 14-2 and the feed line 16 is a second capacitor 50 (Cdt). Moreover, an electrode of a metal fourth layer (a 4MT) is formed.

In the second embodiment, the three metal layers form the two interlayer capacitances (the capacitor 44 and the capacitor 50). In the A-A' section across the transistor 122, as illustrated in FIG. 8, the second data line 14-2 is thicker than the first data line 14-1 and the feed line 16. However, in the major portion excluding the A-A' section, as illustrated in the B-B' section of FIG. 9, the second data line 14-2 is thinner than the first data line 14-1 and the feed line 16. Therefore, in a case where the line widths of the feed line 16 and second data line 14-2 vary, neither the capacitor 44 (Crf1) nor the capacitor 50 (Cdt) change unless these line widths become narrower than that of the first data line 14-1. On the other hand, in a case where the line width of the data line 14-2 varies, the capacitor 44 (Crf1) and the capacitor 50 (Cdt) change at approximately the same ratio. It is thus possible to maintain the consistency of uniformity.

4. Third Embodiment of the Present Technology

Figure 10:
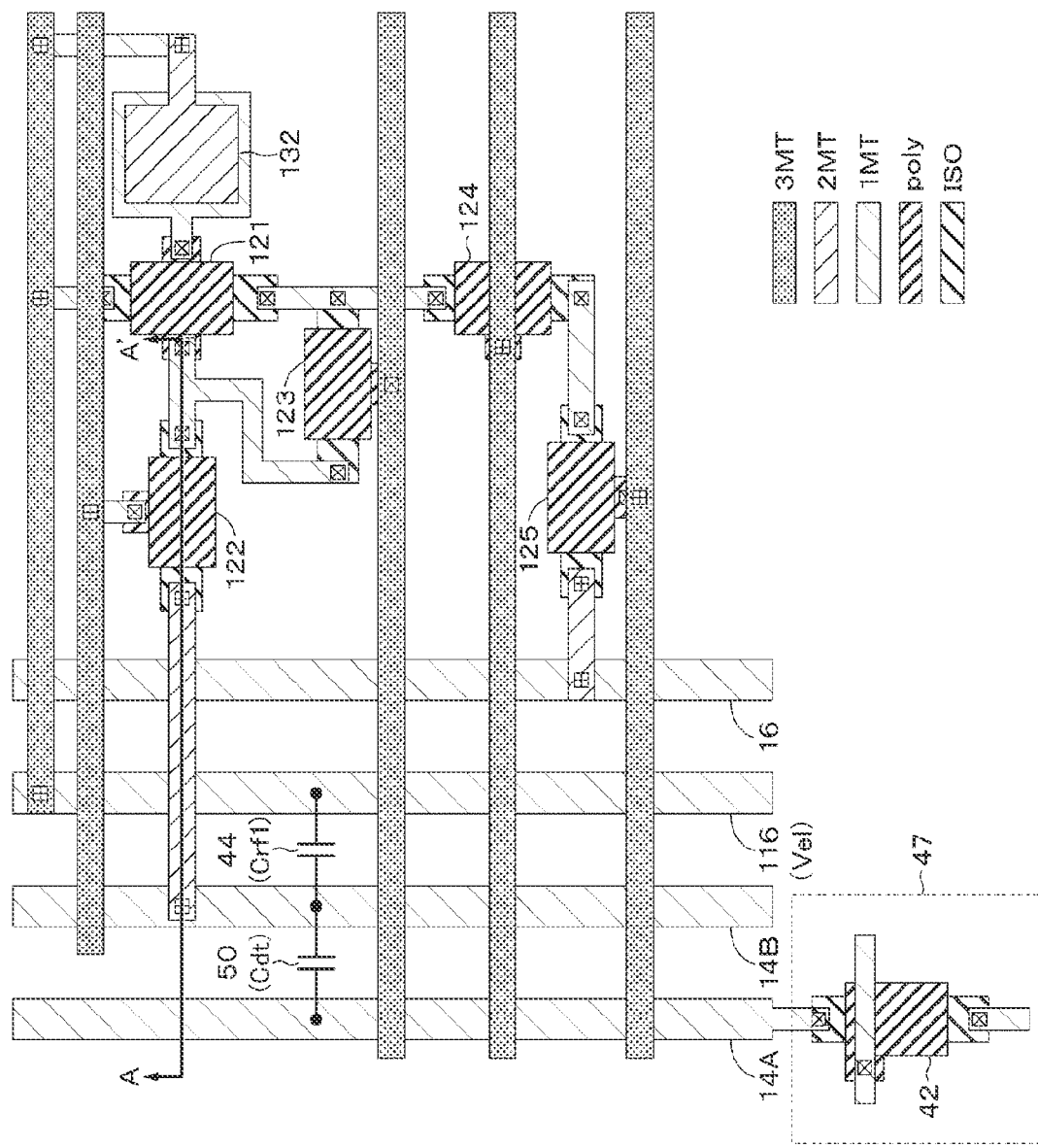
FIG. 10 is a plan view illustrating a layout of a third embodiment of the present technology.
Figure 11:
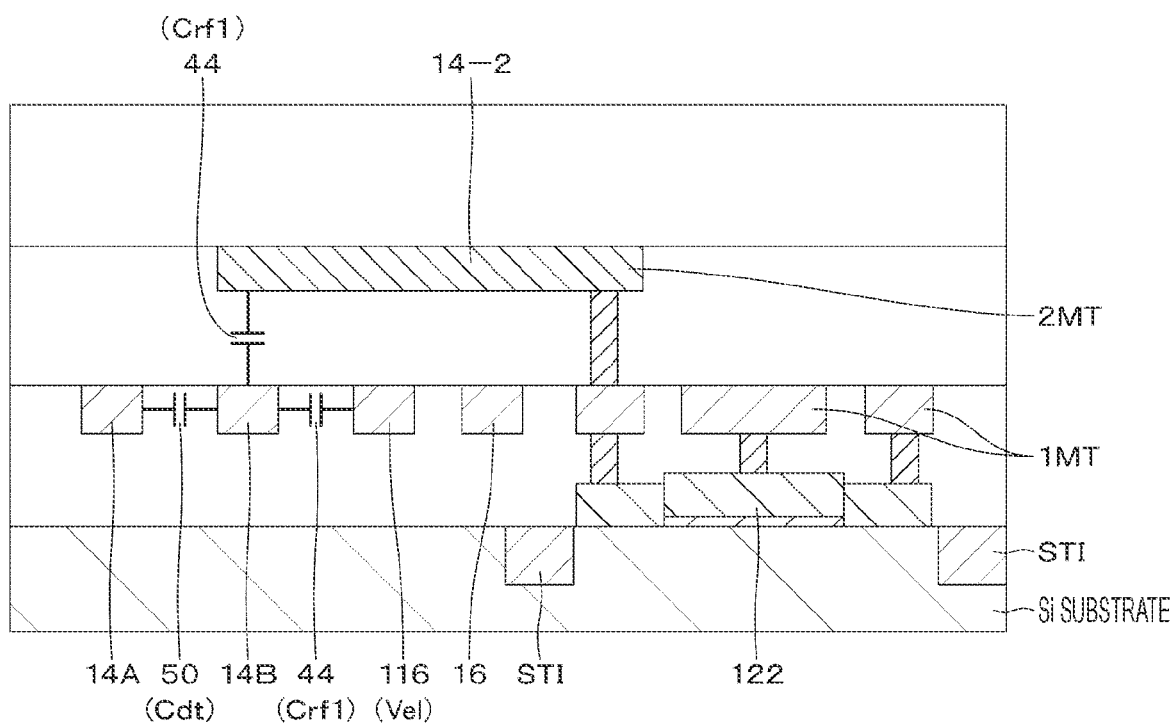
FIG. 11 is a sectional view of the third embodiment of the present technology.

With reference to FIG. 10 and FIG. 11 (a sectional view taken along line A-A' in FIG. 10), a description will be given of a third embodiment of the present technology. In the third embodiment, a parasitic capacitance formed between a first data line 14A and a second data line 14B forms a retention capacitor (a first capacitor) 44 (Crf1), and a parasitic capacitance between a second data line 14B and a feed line 116 forms a retention capacitor (a second capacitor) 50 (Cdt). A high potential Vel of a power supply is fed to the feed line 116. The first data line 14A, the second data line 14B, a feed line 16, and the feed line 116 are formed of a metal on the same layer, for example, a 1MT (a metal first layer). Note that the first data line 14A, the second data line 14B, the feed line 16, and the feed line 116 may be formed to be equal in width and thickness to one another. Furthermore, one of electrode materials such as aluminum and copper is used as a metal material.

In the foregoing third embodiment of the present technology, both the capacitor Crf1 and the capacitor Cdt are formed as a parasitic capacitance using a metal on the same layer. Accordingly, in a case where the line widths of the metal forming the data lines 14A and 14B as well as the feed line 116 vary, these capacitors Crf1 and Cdt vary at the same ratio with the same tendency (increase or decrease). It is therefore possible to minimize the degree that the value of the video signal voltage Vsig represented by formula (1) varies due to the variations in line width. It is thus possible to prevent the consistency of uniformity from being impaired.

5. Fourth Embodiment of the Present Technology

Figure 12:
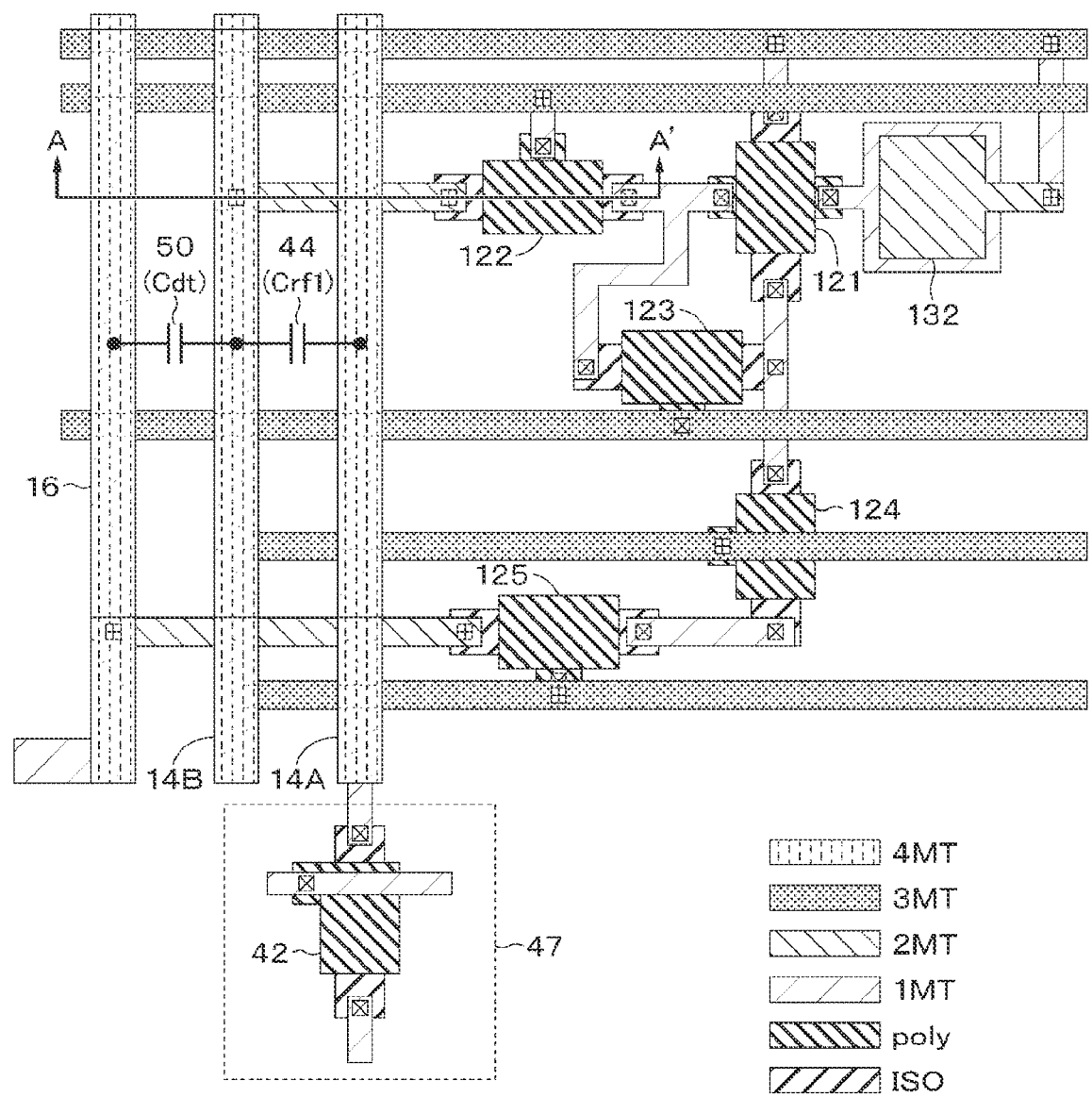
FIG. 12 is a plan view illustrating a layout of a fourth embodiment of the present technology.
Figure 13:
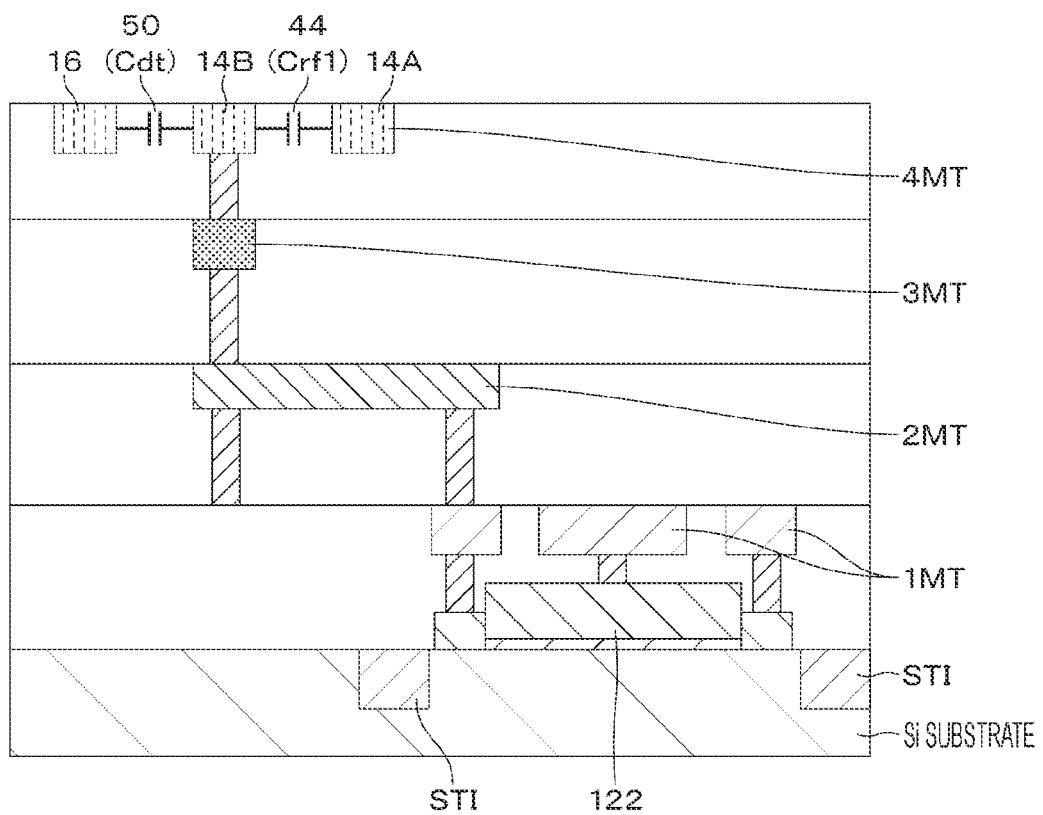
FIG. 13 is a sectional view of the fourth embodiment of the present technology.

With reference to FIG. 12 and FIG. 13 (a sectional view taken along line A-A' in FIG. 12), a description will be given of a fourth embodiment of the present technology. In the foregoing first embodiment (see FIGS. 5 and 6), the first data line 14A, the second data line 14B, and the feed line 16 for forming the first capacitor 44 (Crf1) and the second capacitor 50 (Cdt) are the metal first layer (1MT). In contrast to this, in the fourth embodiment, a first data line 14A, a second data line 14B, and a feed line 16 are formed as a metal fourth layer (4MT). The fifth embodiment can also maintain consistency of uniformity as in the first embodiment.

6. Fifth Embodiment of the Present Technology

Figure 14:
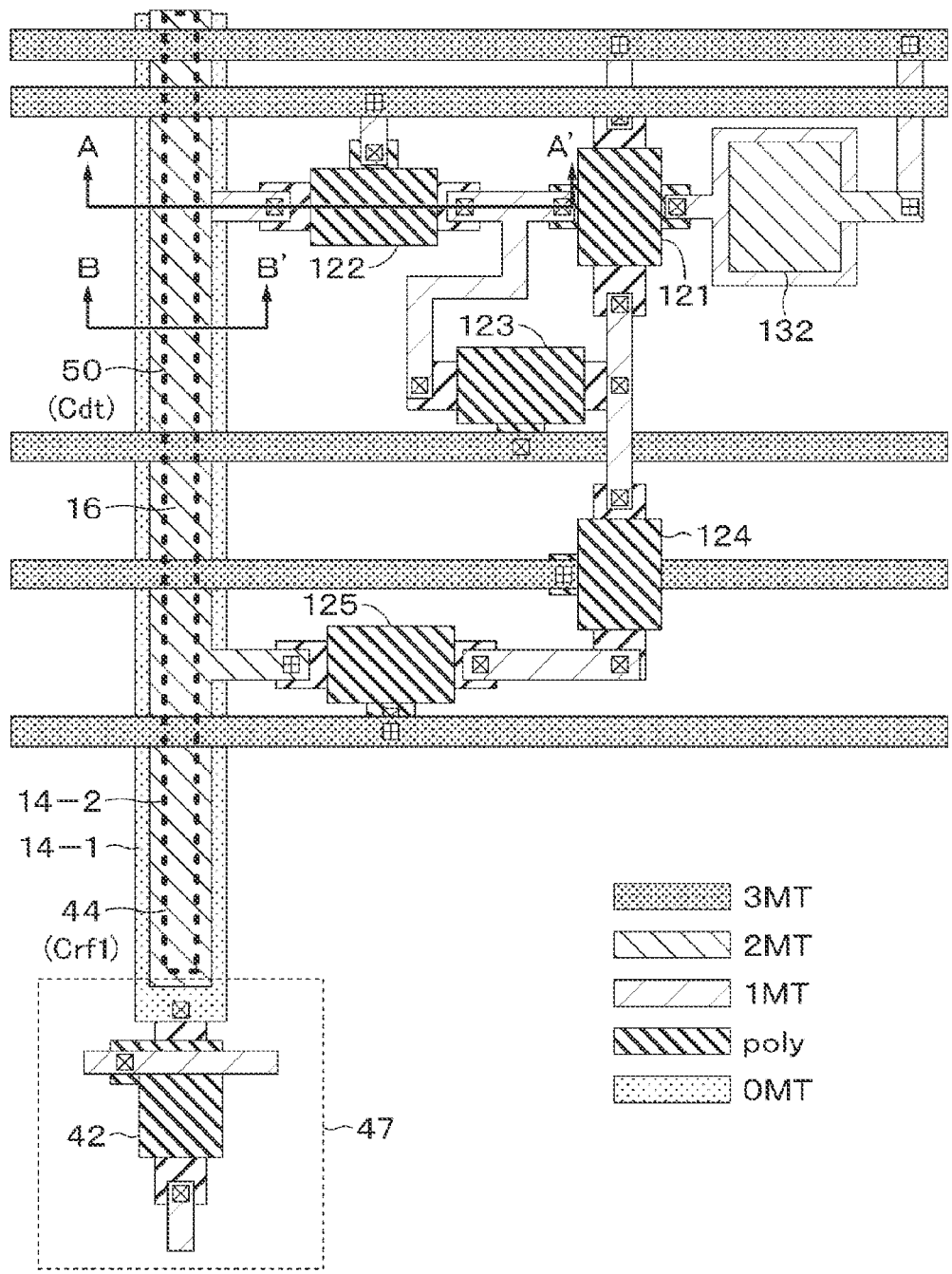
FIG. 14 is a plan view illustrating a layout of a fifth embodiment of the present technology.
Figure 15:
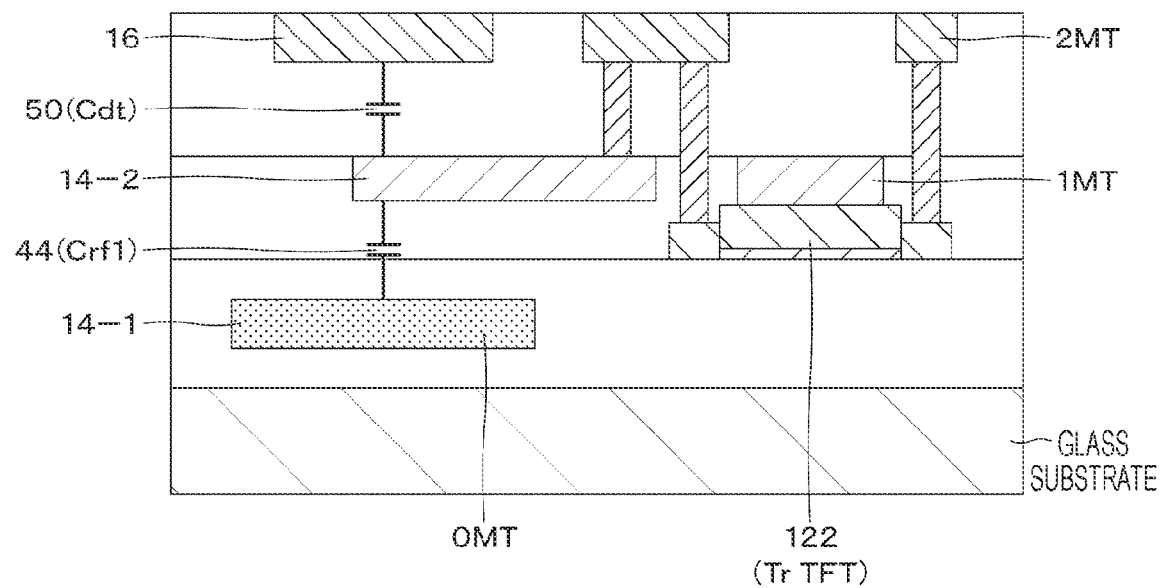
FIG. 15 is a sectional view of the fifth embodiment of the present technology.
Figure 16:
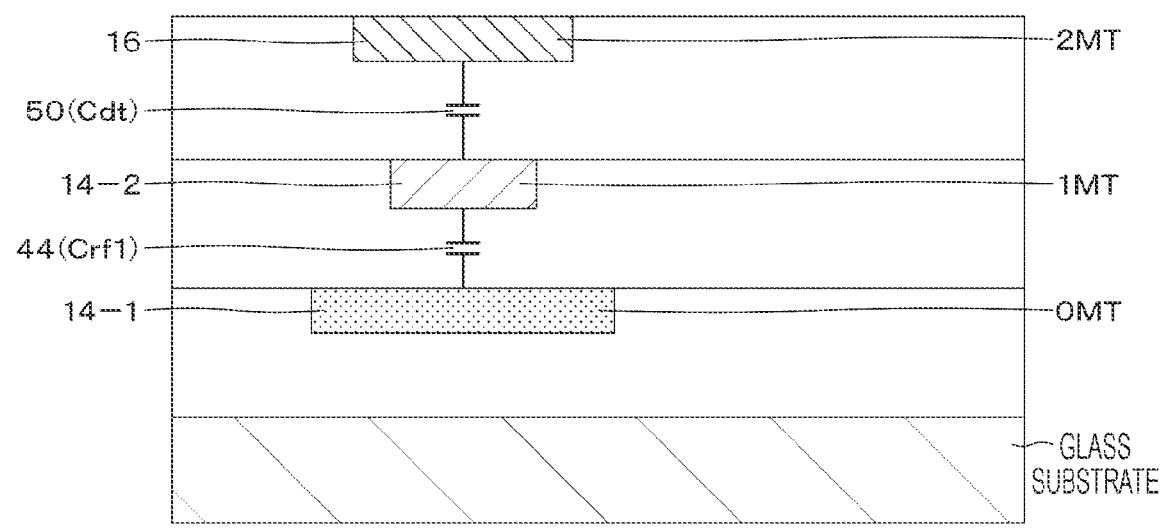
FIG. 16 is a sectional view of the fifth embodiment of the present technology.

With reference to FIG. 14, FIG. 15 (a sectional view taken along line A-A' in FIG. 14), and FIG. 16 (a sectional view taken along line B-B' in FIG. 14), a description will be given of a sixth embodiment of the present technology. In the sixth embodiment, a transistor (TFT) is formed above a glass substrate. The foregoing second embodiment (see FIGS. 7, 8, and 9) describes the vertical relationship among the first data line 14-1 (the metal first layer), the second data line 14-2 (the metal second layer), and the feed line 16 (the metal third layer). In contrast to this, according to the sixth embodiment, a first data line 14-1 is formed as a 0MT, a second data line 14-2 is formed as a metal first layer (a 1MT), and a feed line 16 is formed as a metal second layer (a 2MT) on an insulating layer below an insulating layer where a gate is formed. The sixth embodiment can also maintain consistency of uniformity as in the second and fourth embodiments.

7. Modification Examples

The embodiments of the present technology have been specifically described above. However, the present technology is not limited to each of the foregoing embodiments, and various modifications can be made on the basis of the technical idea of the present technology. For example, the following various modifications can be made. Furthermore, one or more aspects of the following modifications selected arbitrarily may be appropriately combined. Furthermore, the configurations, methods, processes, shapes, materials, numerical values, and the like in the foregoing embodiments can be combined with one another without departing from the scope of the present technology.

In the foregoing embodiments, the transistors are unified as a P channel type, but may be unified as an N channel type. Furthermore, P channel type transistors and N channel type transistors may be combined appropriately.

In the foregoing embodiments, an OLED which is a light emitting element is exemplified as the electrooptical element. Alternatively, the electrooptical element may be, for example, an inorganic light emitting diode, a light emitting diode (LED), or the like as long as it emits light with a brightness according to a current.

8. Application Examples

Next, a description will be given of an electronic apparatus to which the electrooptical devices according to the embodiments and the like and application examples are applied. The electrooptical device is intended for high-definition display with small pixels. Hence, the electronic apparatus is applicable to display apparatuses such as a head mounted display, smart glasses, a smartphone, and an electronic viewfinder for a digital camera.

Note that the present technology can also adopt the following configurations.

(1)
An electrooptical device including:
a scanning line;
a signal line;
a feed line to which a low potential is supplied;
a pixel circuit provided in correspondence with the signal line and the scanning line;
a drive circuit configured to drive the pixel circuit;
a level shift block connected to the signal line;
a first capacitor provided on the level shift block; and
a second capacitor formed by a parasitic capacitance between the signal line and the feed line,
wherein
a video signal voltage is written into the pixel circuit by capacitive coupling between the first capacitor and the second capacitor,
the signal line is formed of a first metal layer,
the feed line is formed of a second metal layer that is approximately equal in width to the first metal layer, and
the first metal layer and the second metal layer form the first capacitor and the second capacitor.

(2)
The electrooptical device as recited in (1), in which
a third metal layer having a width that is approximately equal to a width of the first metal layer is provided on a same layer as and in parallel with the first metal layer and the second metal layer,
the first capacitor is formed by a parasitic capacitance between the first metal layer and the third metal layer, and
the second capacitor is formed by a parasitic capacitance between the second metal layer and the third metal layer.

(3)
The electrooptical device as recited in (1) or (2), in which
a third metal layer having a width that is approximately equal to a width of the first metal layer is disposed above the first metal layer,
the second metal layer is disposed above the third metal layer,
the first capacitor is formed by an interlayer capacitance between the first metal layer and the third metal layer, and
the second capacitor is formed by an interlayer capacitance between the third metal layer and the second metal layer.

(4)
The electrooptical device as recited in any of (1) to (3), in which
the pixel circuit includes:
a first transistor including a gate electrode, a first current end, and a second current end;
a light emitting element configured to emit light with a brightness according to an amount of current supplied through the first transistor;
a second transistor connected between the signal line and the gate electrode of the first transistor;
a third transistor configured to bring the first current end of the first transistor and the gate electrode of the first transistor into conduction;
a fourth transistor inserted between the first current end and one of terminals of the light emitting element; and
a fifth transistor inserted between the feed line and one of the terminals of the light emitting element.

(5)
An electronic apparatus including:
the electrooptical device as recited in (1).

(6)
The electronic apparatus as recited in (5), in which
in the electrooptical device,
a third metal layer having a width that is approximately equal to a width of the first metal layer is provided on a same layer as and in parallel with the first metal layer and the second metal layer,
the first capacitor is formed by a parasitic capacitance between the first metal layer and the third metal layer, and
the second capacitor is formed by a parasitic capacitance between the second metal layer and the third metal layer.

(7)
The electronic apparatus as recited in (5) or (6), in which
in the electrooptical device,
a third metal layer having a width that is approximately equal to a width of the first metal layer is disposed above the first metal layer,
the second metal layer is disposed above the third metal layer,
the first capacitor is formed by an interlayer capacitance between the first metal layer and the third metal layer, and
the second capacitor is formed by an interlayer capacitance between the third metal layer and the second metal layer.

(8)
The electronic apparatus as recited in any one of (5) to (7), in which
in the electrooptical device,
the pixel circuit includes:
a first transistor including a gate electrode, a first current end, and a second current end;
a light emitting element configured to emit light with a brightness according to an amount of current supplied through the first transistor;
a second transistor connected between the signal line and the gate electrode of the first transistor;
a third transistor configured to bring the first current end of the first transistor and the gate electrode of the first transistor into conduction;

a fourth transistor inserted between the first current end and one of terminals of the light emitting element; and a fifth transistor inserted between the feed line and one of the terminals of the light emitting element.

REFERENCE SIGNS LIST

12 Scanning line
14, 14-1, 14-2, 14A, 14B Data line
16 Feed line
42 Transmission gate
44 First capacitor
50 Second capacitor
110 Pixel circuit
116 Feed line
121 First transistor
122 Second transistor
123 Third transistor
124 Fourth transistor
125 Fifth transistor
130 OLED
MT1 Metal first layer
MT2 Metal second layer
MT3 Metal third layer
MT4 Metal fourth layer
MT5 Metal fifth layer

The invention claimed is:

1. An electrooptical device comprising:
a scanning line;
a signal line;
a feed line to which a low potential is supplied;
a pixel circuit provided in correspondence with the signal line and the scanning line;
a drive circuit configured to drive the pixel circuit;
a level shift block connected to the signal line;
a first capacitor provided on the level shift block; and
a second capacitor formed by a parasitic capacitance between the signal line and the feed line,
wherein
a video signal voltage is written into the pixel circuit by capacitive coupling between the first capacitor and the second capacitor,
the signal line is formed of a first metal layer,
the feed line is formed of a second metal layer that is approximately equal in width to the first metal layer, and
the first metal layer and the second metal layer form the first capacitor and the second capacitor.

2. The electrooptical device according to claim 1, wherein
a third metal layer having a width that is approximately equal to a width of the first metal layer is provided on a same layer as and in parallel with the first metal layer and the second metal layer,
the first capacitor is formed by a parasitic capacitance between the first metal layer and the third metal layer, and
the second capacitor is formed by a parasitic capacitance between the second metal layer and the third metal layer.

3. The electrooptical device according to claim 1, wherein
a third metal layer having a width that is approximately equal to a width of the first metal layer is disposed above the first metal layer,
the second metal layer is disposed above the third metal layer, the first capacitor is formed by an interlayer capacitance between the first metal layer and the third metal layer, and
the second capacitor is formed by an interlayer capacitance between the third metal layer and the second metal layer.

4. The electrooptical device according to claim 1, wherein the pixel circuit includes:
a first transistor including a gate electrode, a first current end, and a second current end;
a light emitting element configured to emit light with a brightness according to an amount of current supplied through the first transistor;
a second transistor connected between the signal line and the gate electrode of the first transistor;
a third transistor configured to bring the first current end of the first transistor and the gate electrode of the first transistor into conduction;
a fourth transistor inserted between the first current end and one of terminals of the light emitting element; and
a fifth transistor inserted between the feed line and one of the terminals of the light emitting element.

5. An electronic apparatus comprising:
the electrooptical device according to claim 1.

6. The electronic apparatus according to claim 5, wherein
in the electrooptical device,
a third metal layer having a width that is approximately equal to a width of the first metal layer is provided on a same layer as and in parallel with the first metal layer and the second metal layer,
the first capacitor is formed by a parasitic capacitance between the first metal layer and the third metal layer, and
the second capacitor is formed by a parasitic capacitance between the second metal layer and the third metal layer.

7. The electronic apparatus according to claim 5, wherein
in the electrooptical device,
a third metal layer having a width that is approximately equal to a width of the first metal layer is disposed above the first metal layer,
the second metal layer is disposed above the third metal layer,
the first capacitor is formed by an interlayer capacitance between the first metal layer and the third metal layer, and
the second capacitor is formed by an interlayer capacitance between the third metal layer and the second metal layer.

8. The electronic apparatus according to claim 5, wherein
in the electrooptical device,
the pixel circuit includes:
a first transistor including a gate electrode, a first current end, and a second current end;
a light emitting element configured to emit light with a brightness according to an amount of current supplied through the first transistor;
a second transistor connected between the signal line and the gate electrode of the first transistor;
a third transistor configured to bring the first current end of the first transistor and the gate electrode of the first transistor into conduction;
a fourth transistor inserted between the first current end and one of terminals of the light emitting element; and a fifth transistor inserted between the feed line and one of the terminals of the light emitting element.

\* \* \* \* \*